US011721762B2

(12) United States Patent
Zhang et al.

(10) Patent No.: US 11,721,762 B2
(45) Date of Patent: *Aug. 8, 2023

(54) FIN FIELD EFFECT TRANSISTOR (FINFET) DEVICE AND METHOD FOR FORMING THE SAME

(71) Applicant: Taiwan Semiconductor Manufacturing Co., Ltd., Hsinchu (TW)

(72) Inventors: Zhe-Hao Zhang, Hsinchu (TW); Tung-Wen Cheng, New Taipei (TW); Che-Cheng Chang, New Taipei (TW); Yung-Jung Chang, Cyonglin Township (TW); Chang-Yin Chen, Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 332 days.

This patent is subject to a terminal disclaimer.

(21) Appl. No.: 17/099,456

(22) Filed: Nov. 16, 2020

(65) Prior Publication Data
US 2021/0074859 A1 Mar. 11, 2021

Related U.S. Application Data

(60) Continuation of application No. 16/231,032, filed on Dec. 21, 2018, now Pat. No. 10,840,378, which is a (Continued)

(51) Int. Cl.
*H01L 29/78* (2006.01)
*H01L 29/66* (2006.01)
(Continued)

(52) U.S. Cl.
CPC .... *H01L 29/7851* (2013.01); *H01L 21/30604* (2013.01); *H01L 21/31116* (2013.01); (Continued)

(58) Field of Classification Search
CPC ................ H01L 29/66795; H01L 29/785
See application file for complete search history.

(56) References Cited

U.S. PATENT DOCUMENTS 7,692,254 B2 4/2010 Anderson et al.
7,755,104 B2 7/2010 Yagishita
(Continued)

FOREIGN PATENT DOCUMENTS

CN 102832236 A 12/2012
CN 102969340 A 3/2013
(Continued)

*Primary Examiner* — Christopher A Johnson
(74) *Attorney, Agent, or Firm* — Slater Matsil, LLP

(57) ABSTRACT

A fin field effect transistor (FinFET) device structure and method for forming FinFET device structure are provided. The FinFET structure includes a substrate and an isolation structure formed on the substrate. The FinFET structure also includes a fin structure extending above the substrate, and the fin structure is embedded in the isolation structure. The FinFET structure further includes an epitaxial structure formed on the fin structure, the epitaxial structure has a pentagon-like shape, and an interface between the epitaxial structure and the fin structure is lower than a top surface of the isolation structure.

20 Claims, 6 Drawing Sheets

Related U.S. Application Data division of application No. 14/517,209, filed on Oct. 17, 2014, now Pat. No. 10,164,108.

(51) Int. Cl.

| | | |
|---|---|---|
| *H01L 21/762* | (2006.01) | |
| *H01L 21/306* | (2006.01) | |
| *H01L 29/165* | (2006.01) | |
| *H01L 21/8234* | (2006.01) | |
| *H01L 29/08* | (2006.01) | |
| *H01L 27/088* | (2006.01) | |
| *H01L 21/311* | (2006.01) | |

(52) U.S. Cl.
CPC ............ *H01L 21/76224* (2013.01); *H01L 21/823412* (2013.01); *H01L 21/823431* (2013.01); *H01L 21/823481* (2013.01); *H01L 27/0886* (2013.01); *H01L 29/0847* (2013.01); *H01L 29/165* (2013.01); *H01L 29/6653* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 7,799,592 B2 | 9/2010 | Lochtefeld |
| 7,985,633 B2 | 7/2011 | Cai et al. |
| 8,264,021 B2 | 9/2012 | Lai et al. |
| 8,669,607 B1 | 3/2014 | Tsair et al. |
| 8,796,093 B1 | 8/2014 | Cheng et al. |
| 8,890,207 B2 | 11/2014 | Wu et al. |
| 8,980,701 B1 | 3/2015 | Lu et al. |
| 9,171,925 B2 | 10/2015 | Kuo et al. |
| 9,337,285 B2 | 5/2016 | Wann et al. |
| 9,337,315 B2 | 5/2016 | Basker et al. |
| 9,391,200 B2 | 7/2016 | Liu et al. |
| 9,653,605 B2 | 5/2017 | Zhang et al. |
| 10,546,956 B2 | 1/2020 | Zhang et al. |
| 2005/0239254 A1 | 10/2005 | Chi et al. |
| 2007/0176253 A1 | 8/2007 | Wang et al. |
| 2008/0132077 A1 | 6/2008 | Morishima |
| 2011/0079829 A1 | 4/2011 | Lai et al. |
| 2011/0147842 A1 | 6/2011 | Cappellani et al. |
| 2012/0319211 A1 | 12/2012 | van Dal et al. |
| 2013/0049068 A1 | 2/2013 | Lin et al. |
| 2013/0084708 A1 | 4/2013 | Jain et al. |
| 2013/0095616 A1 | 4/2013 | Tsai et al. |
| 2013/0122676 A1 | 5/2013 | Jeng |
| 2013/0187228 A1 | 7/2013 | Xie et al. |
| 2013/0200455 A1 | 8/2013 | Lo et al. |
| 2013/0221443 A1 | 8/2013 | Lin et al. |
| 2013/0228865 A1 | 9/2013 | Lin et al. |
| 2013/0270559 A1 | 10/2013 | Hafez et al. |
| 2013/0285153 A1 | 10/2013 | Lee et al. |
| 2013/0313619 A1 | 11/2013 | Fumitake |
| 2014/0011341 A1 | 1/2014 | Maszara et al. |
| 2014/0035066 A1 | 2/2014 | Tsai et al. |
| 2014/0065782 A1 | 3/2014 | Lu et al. |
| 2014/0106528 A1 | 4/2014 | Quyang et al. |
| 2014/0117455 A1* | 5/2014 | Liu .................... H01L 21/764 257/E21.409 |
| 2014/0134814 A1 | 5/2014 | Wong et al. |
| 2014/0167264 A1* | 6/2014 | Besser ............. H01L 29/66795 438/664 |
| 2014/0217517 A1 | 8/2014 | Cai et al. |
| 2014/0252489 A1 | 9/2014 | Yu et al. |
| 2014/0361373 A1* | 12/2014 | Hung ................. H01L 29/7848 257/365 |
| 2014/0363935 A1 | 12/2014 | Fu et al. |
| 2014/0374840 A1 | 12/2014 | Lee et al. |
| 2015/0035023 A1 | 2/2015 | Kim et al. |
| 2015/0091100 A1 | 4/2015 | Xie et al. |
| 2015/0214366 A1 | 7/2015 | Chang et al. |
| 2015/0255352 A1 | 9/2015 | Chuang et al. |
| 2015/0255542 A1 | 9/2015 | Cai et al. |
| 2015/0255543 A1 | 9/2015 | Cheng et al. |
| 2015/0255576 A1 | 9/2015 | Liao et al. |
| 2015/0270263 A1 | 9/2015 | Zhu |
| 2015/0294969 A1 | 10/2015 | Lee et al. |
| 2015/0303118 A1 | 10/2015 | Wang et al. |
| 2015/0372140 A1 | 12/2015 | Liu et al. |
| 2016/0025671 A1 | 1/2016 | Johnson et al. |
| 2016/0049399 A1 | 2/2016 | Park et al. |
| 2016/0087104 A1 | 3/2016 | Lee et al. |
| 2016/0111420 A1 | 4/2016 | Zhang et al. |
| 2016/0197075 A1 | 7/2016 | Li et al. |
| 2016/0225671 A1 | 8/2016 | Olac-Vaw et al. |
| 2017/0309730 A1 | 10/2017 | Lee et al. |
| 2018/0122908 A1 | 5/2018 | Balakrishnan et al. |

FOREIGN PATENT DOCUMENTS

| | | |
|---|---|---|
| CN | 103247535 A | 8/2013 |
| CN | 103296084 A | 9/2013 |
| CN | 103426765 A | 12/2013 |
| CN | 103681347 A | 3/2014 |
| CN | 103811345 A | 5/2014 |
| JP | 2007149942 A | 6/2007 |
| JP | 2007294757 A | 11/2007 |
| KR | 1020130091620 A | 8/2013 |
| KR | 20130120973 A | 11/2013 |
| KR | 20140020707 A | 2/2014 |
| KR | 1020140029094 A | 3/2014 |
| KR | 1020140086807 A | 7/2014 |
| KR | 1020140111575 A | 9/2014 |
| TW | I456760 B | 10/2014 |
| TW | I463655 B | 12/2014 |
| TW | I496291 B | 8/2015 |

* cited by examiner

FIN FIELD EFFECT TRANSISTOR (FINFET) DEVICE AND METHOD FOR FORMING THE SAME

PRIORITY CLAIM AND CROSS-REFERENCE

This application is a continuation of U.S. patent application Ser. No. 16/231,032 entitled "Fin Field Effect Transistor (FinFET) Device and Method for Forming the Same," filed Dec. 21, 2018, which is a divisional of U.S. patent application Ser. No. 14/517,209 entitled "Fin Field Effect Transistor (FinFET) Device and Method for Forming the Same," filed on Oct. 17, 2014, now U.S. Pat. No. 10,164,108, issued on Dec. 25, 2018, which applications are hereby incorporated herein by reference.

This application is related to the following and commonly assigned patent applications: U.S. patent application Ser. No. 14/517,310, filed on Oct. 17, 2014 and entitled "Fin field effect transistor (FinFET) device and method for forming the same," now U.S. Pat. No. 9,653,605 issued on May 16, 2017, and U.S. Provisional Patent Application No. 62/075,015, filed Nov. 4, 2014 and entitled "Fin field effect transistor (FinFET) device and method for forming the same."

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
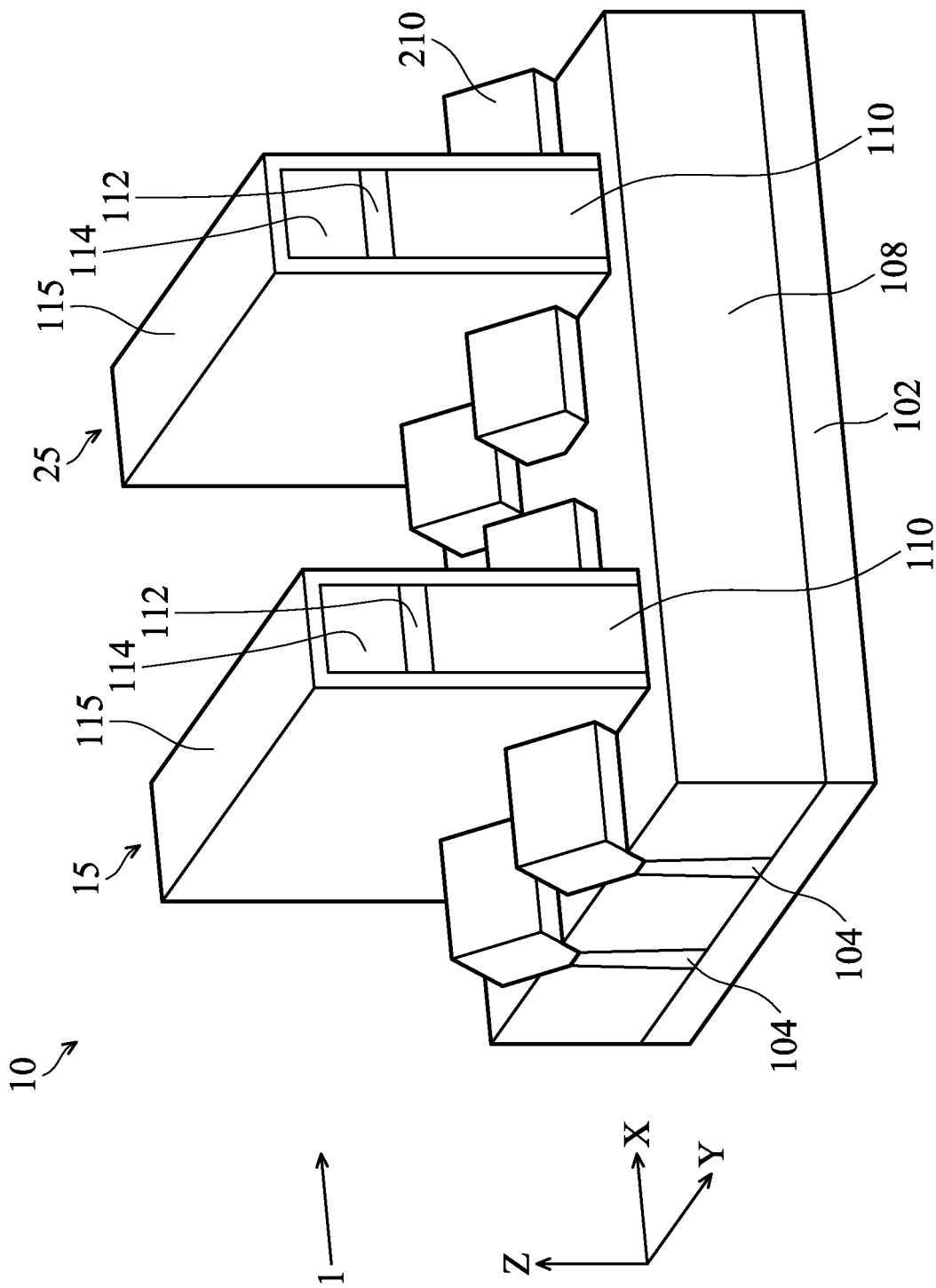
FIG. 1 shows a perspective representation of a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIG. 1 shows a perspective representation of a fin field effect transistor (FinFET) device structure 10, in accordance with some embodiments of the disclosure. The FinFET device structure 10 includes a N-type FinFET device structure (NMOS) 15 and a P-type FinFET device structure (PMOS) 25.

The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide (SiC), gallium arsenic (GaAs), indium arsenide (InAs), or indium phosphide (InP). In some embodiments, the substrate 102 is made of an alloy semiconductor such as silicon germanium (SiGe), silicon germanium carbide (SiGeC), gallium arsenic phosphide (GaAsP), or gallium indium phosphide (GaInP). In some embodiments, the substrate 102 includes an epitaxial layer. For example, the substrate 102 has an epitaxial layer overlying a bulk semiconductor.

The FinFET device structure 10 also includes one or more fin structure 104 (e.g., Si fins) that extend from the substrate 102. The fin structure 104 may optionally include germanium (Ge). The fin structure 104 may be formed by using suitable processes such as photolithography and etching processes. In some embodiments, the fin structure 104 is etched from substrate 102 using dry etch or plasma processes.

In some other embodiments, the fin structure 104 can be formed by a double-patterning lithography (DPL) process.

DPL process is a method of constructing a pattern on a substrate by dividing the pattern into two interleaved patterns. DPL process allows enhanced feature (e.g., fin) density.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown). The gate stack structure is formed over a central portion of the fin structure 104. In some other embodiments, multiple gate stack structures are formed over the fin structure 104.

In some other embodiments, the gate stack structure is a dummy gate stack and is replaced later by a metal gate (MG) after high thermal budget processes are performed.

The Gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). In some embodiments, the gate stack structure includes additional layers, such as interfacial layers, capping layers, diffusion/barrier layers, or other applicable layers.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process, a wet etching process or a combinations thereof. Alternatively, the photolithography process is implemented or replaced by other proper methods such as maskless photolithography, electron-beam writing, and ion-beam writing.

FIGS. 2A-2F show side views of various stages of forming a fin field effect transistor (FinFET) device structure, in accordance with some embodiments of the disclosure. FIGS. 2A-2F show side views taken along arrow 1 of FIG. 1 and arrow 1 is parallel to the X-axis.

Figure 2A:
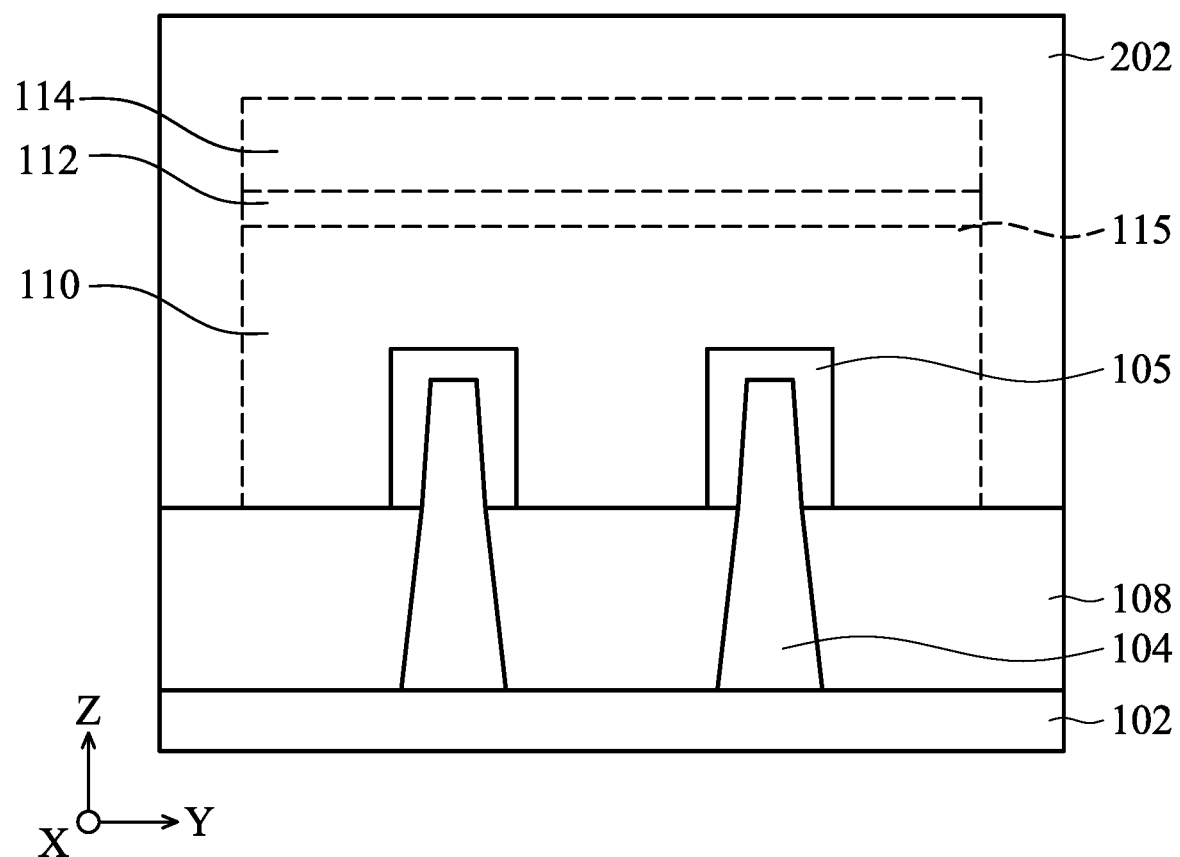
FIGS. 2A-2F show side views of various stages of forming a fin field effect transistor (FinFET) device structure, in accordance with some embodiments of the disclosure.

Referring to FIG. 2A, a first hard mask layer 112 is formed on the gate electrode 110, and a second hard mask layer 114 is formed on the first hard mask layer 112. In some embodiments, the first hard mask layer 112 is made of silicon oxide, silicon nitride, silicon oxynitride, or other applicable materials. In some embodiments, the second hard mask layer 114 is made of silicon oxide, silicon nitride, silicon oxynitride, or other applicable materials.

Gate sidewall spacers 115 are formed on the opposite sidewalls of the gate electrode 110, fin sidewall spacers 105 are formed on the opposite sidewalls of the fin structure 104. The gate sidewall spacers 115 and the fin sidewall spacers 105 independently include dielectric materials, such as silicon oxide, silicon nitride, silicon carbide (SiC), silicon oxynitride, or combinations thereof.

Afterwards, a bottom anti-reflective coating (BARC) layer 202 is formed on the gate sidewall spacers 115. The BARC layer 202 is used under a photoresist layer for enhancing pattern transfer to the hard mask layers 112, 114 during a patterning process. In some embodiments, when an implantation process is performed on N-type FinFET device structure (NMOS) 15, the BARC 202 and a photoresist (not shown) which is formed on the BARC 202 are formed on the gate electrode 110 to cover the gate electrode 110 in the P-type FinFET device structure (PMOS) 25.

Figure 2B:
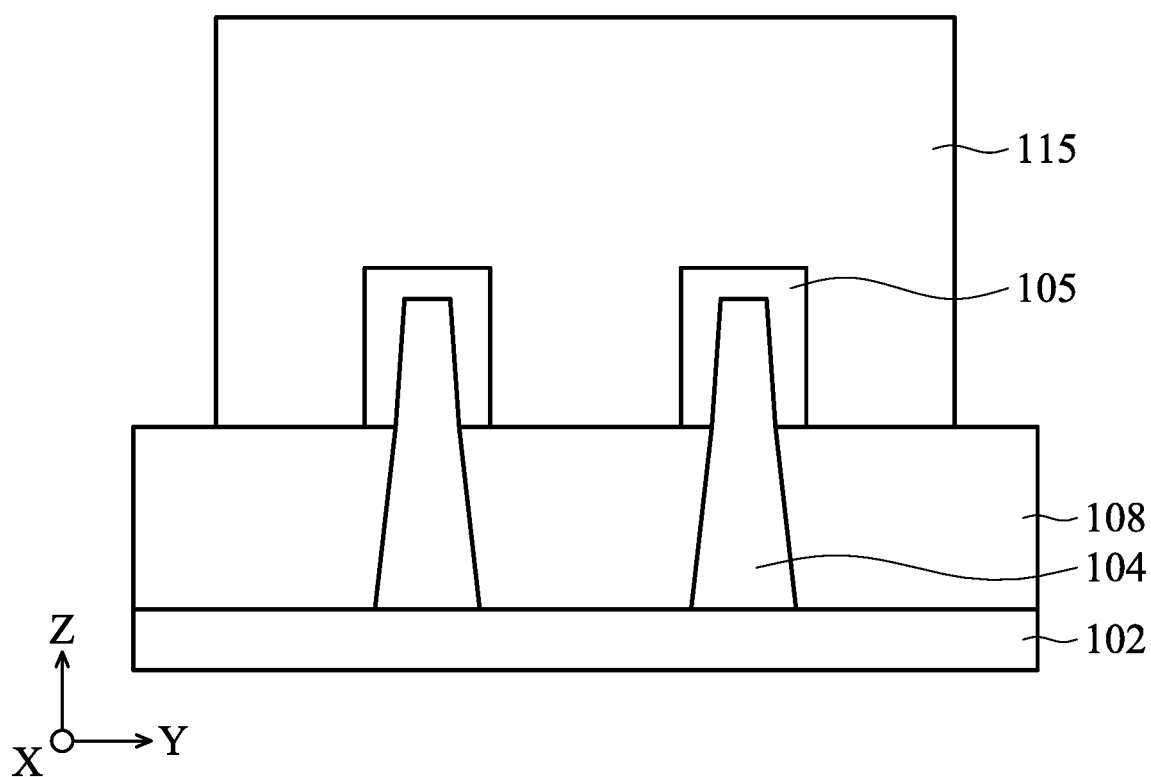

Afterwards, the photoresist (not shown) and BARC 202 are removed by an etching process as shown in FIG. 2B, in accordance with some embodiments of the disclosure. The etching process may be a dry etching process or a wet etching process. In some embodiments, a first dry etching process is operated at a pressure in a range from about 3 mtorr to about 50 mtorrr. In some embodiments, the gas used in the first dry etching process includes methane ($CH_4$), nitrogen ($N_2$), helium (He), oxygen ($O_2$) or combinations thereof. In some embodiments, the first dry etching process is operated by a power in a range from about 50 W to about 1000 W. In some embodiments, the first dry etching process is operated at a temperature in range from about 20° C. to about 80° C.

Figure 2C:
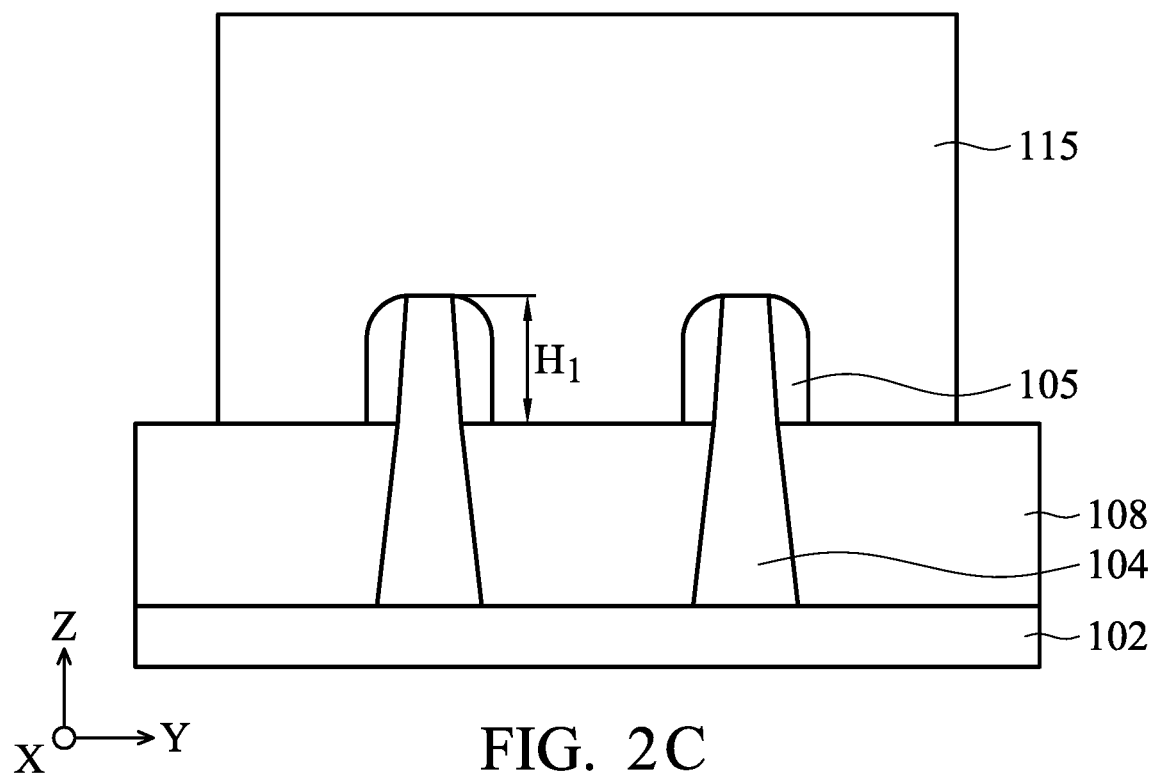

After the BARC 202 is removed, a portion of the gate sidewall spacers 115 and a portion of the fin sidewall spacers 105 are removed as shown in FIG. 2C, in accordance with some embodiments of the disclosure. More specifically, a top portion of the gate sidewall spacers 115 is removed to expose the second hard mask layer 114. A top portion of the fin sidewall spacers 105 is removed to expose the fin structure 104.

In some embodiments, when the gate sidewall spacers 115 and the fin sidewall spacers 105 are made of silicon nitride, a second etching process is performed to remove the silicon nitride. In some embodiments, the second etching process is a second dry etching process and is operated at a pressure in a range from about 3 mtorr to about 50 mtorrr. In some embodiments, the gas used in the second dry etching process includes fluoromethane ($CH_3F$), difluoromethane ($CH_2F_2$), methane ($CH_4$), argon (Ar), hydrogen bromide (HBr) nitrogen ($N_2$), helium (He), oxygen ($O_2$) or combinations thereof. In some embodiments, the second dry etching process is operated by power in a range from about 50 W to about 1000 W. In some embodiments, the second dry etching process is operated at a temperature in range from about 20° C. to about 70° C.

After the second dry etching process, each of the fin sidewall spacers 105 has a first height $H_1$. In some embodiments, the first height $H_1$ is in a range from about 0.1 nm to about 50 nm.

Figure 2D:
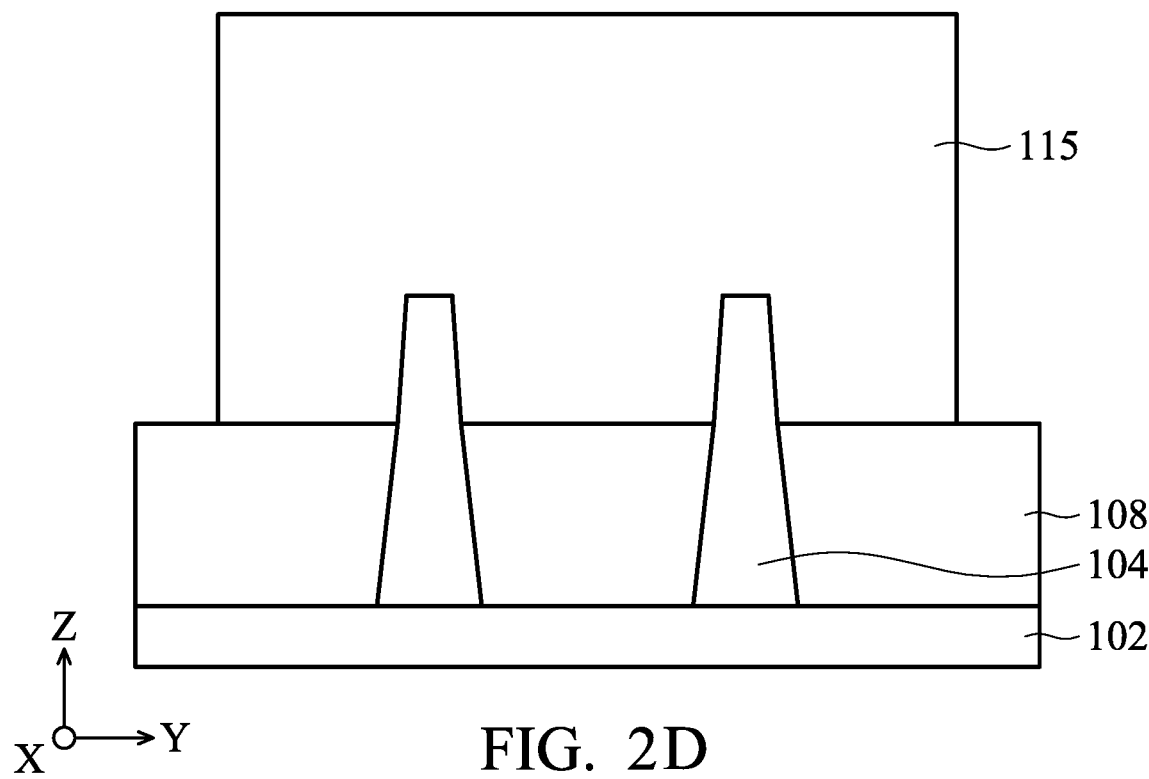

After the portion of the gate sidewall spacers 115 and the portion of the fin sidewall spacers 105 are removed, the remaining fin sidewall spacers 105 are removed as shown in FIG. 2D, in accordance with some embodiments of the disclosure. The fin sidewall spacers 105 are removed by a third etching process. The third etching process may be a dry etching process or a wet etching process.

In some embodiments, the third etching process is a third dry etching process and is operated at a pressure in a range from about 3 mtorr to about 50 mtorrr. In some embodiments, the gas used in the third dry etching process includes fluoromethane ($CH_3F$), difluoromethane ($CH_2F_2$), methane ($CH_4$), argon (Ar), hydrogen bromide (HBr) nitrogen ($N_2$), helium (He) or oxygen ($O_2$) or combinations thereof. In some embodiments, the third dry etching process is operated by a power in a range from about 50 W to about 1000 W. In some embodiments, the third dry etching process is operated at a temperature in range from about 20° C. to about 70° C.

Figure 2E:
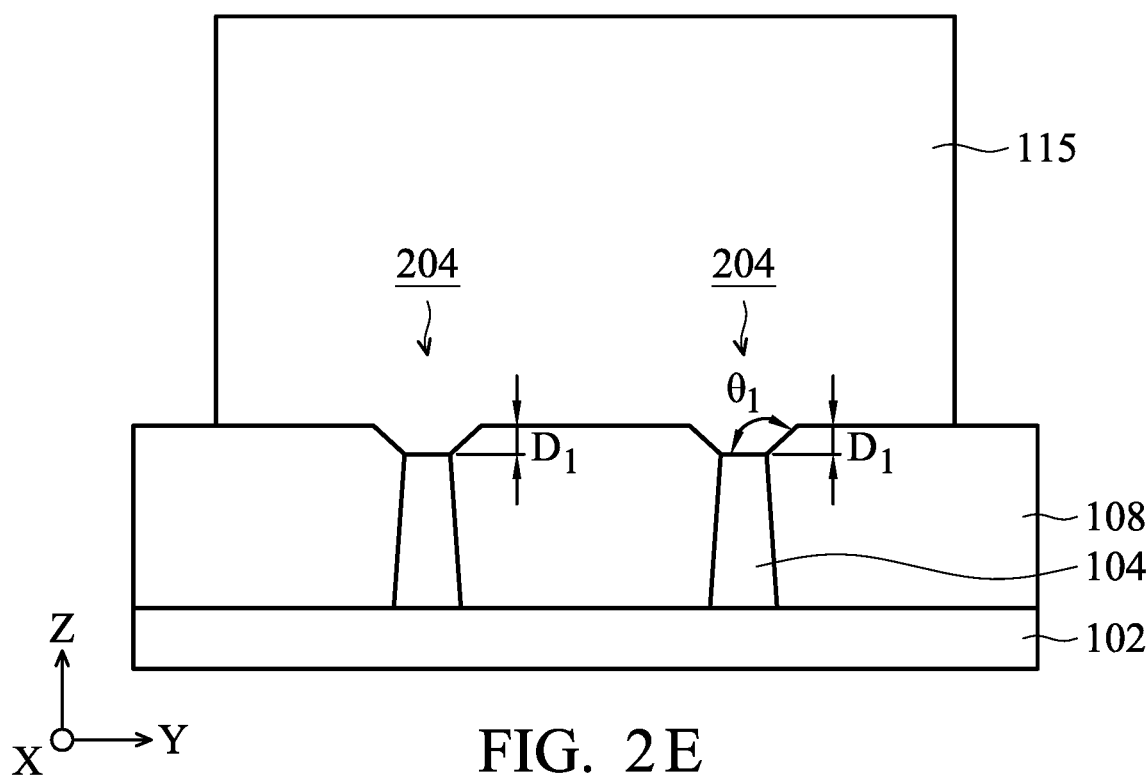
Figure 2F:
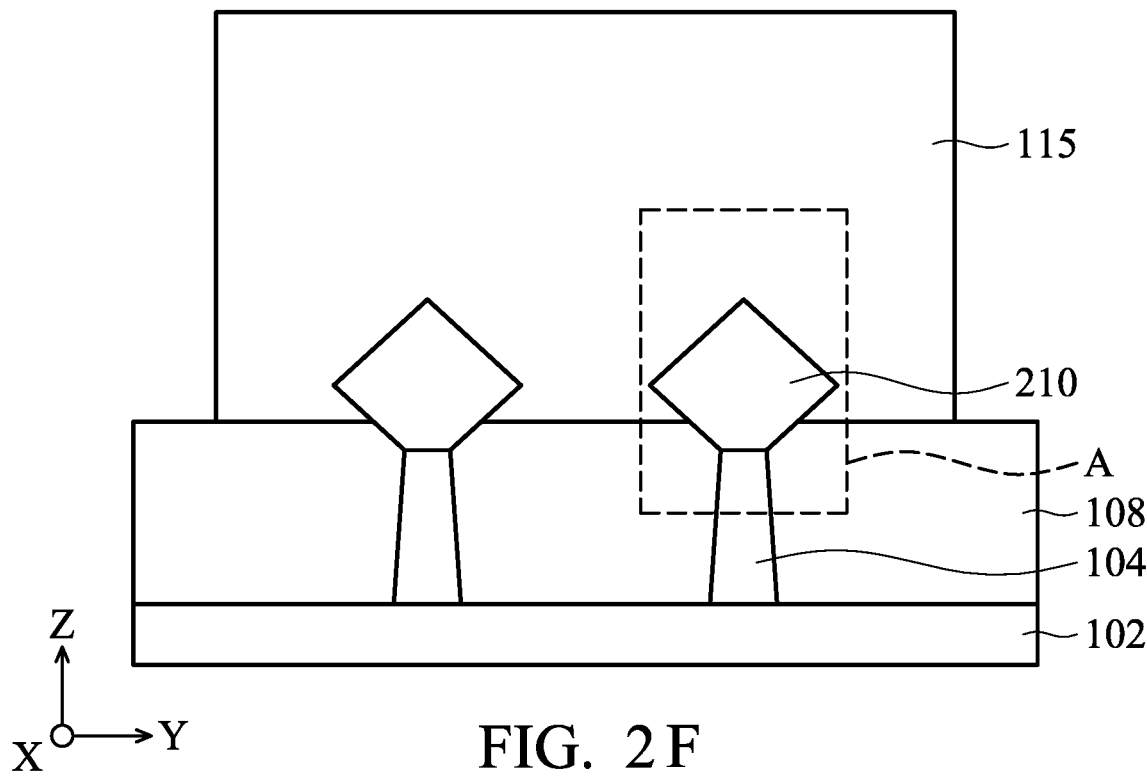

The performance of the FinFET device structure is relative to the volume of an epitaxial structure (such as 210 as shown in FIG. 2F). If the fin sidewall spacers 105 are remaining on the isolation structure, the volume an epitaxial structure (such as 210 as shown in FIG. 2F) will be limited by the fin sidewall spacers 105. In order to obtain a large volume of the epitaxial structure, it should be noted that the overall fin sidewall spacers 105 are removed. In other words, no fin sidewall spacers are formed adjacent to the fin structure 104.

After the third dry etching process, a portion of the fin structure 104 is removed as shown in FIG. 2E, in accordance with some embodiments of the disclosure. Afterwards, a portion of the isolation structure 108 is removed. The fin structure 104 and the isolation structure 108 are independently removed by an etching process, such as a dry etching process or a wet etching process.

After the third dry etching process, a portion of the fin structure 104 is removed as shown in FIG. 2E, in accordance with some embodiments of the disclosure. Afterwards, a portion of the isolation structure 108 is removed. The fin structure 104 and the isolation structure 108 are independently removed by an etching process, such as a dry etching process or a wet etching process.

It should be noted that the epitaxial structure (such as 210, as shown in FIG. 2F) will be formed in the trench 204, and therefore the size of the trench 204 should be well controlled. The trench 204 has a bottom surface and sloping sidewalls adjoined to the bottom surface. The trench 204 has a depth $D_1$ and an angle $\theta_1$ between the bottom surface and the sidewall. In some embodiments, the depth $D_1$ is in a range from about 0.1 nm to about 50 nm. In some embodiments, the angle $\theta_1$ between the bottom surface and the sidewall of the trench 204 is in a range from about 90 degrees to about 175 degrees. If the angle $\theta_1$ is too great, the epitaxial structure (such as 210, as shown in FIG. 2F) may have too large spacing to grow. If the angle $\theta_1$ is too small, the volume of the epitaxial structure (such as 210, as shown in FIG. 2F) will be restricted by small space, and the epitaxial structure will be smaller. The device mobility of the epitaxial structure will be affected by the volume.

After the portion of the fin structure 104 and the portion of the isolation structure 108 are removed, an epitaxial structure 210 is formed on the fin structure 104 as shown in FIG. 2F, in accordance with some embodiments of the disclosure.

The epitaxial structure 210 includes source/drain epitaxial structure. In some embodiments, when an N-type FET (NFET) device is desired, the source/drain epitaxial structures include an epitaxially grown silicon (epi Si). Alternatively, when a P-type FET (PFET) device is desired, epitaxial source/drain structures include an epitaxially growing silicon germanium (SiGe). The epitaxial structure 210 may have a single layer or a multiple layers.

It should be noted that the interface between the epitaxial structure 210 and the fin structure 104 is lower than the top surface of the isolation structure 108. The epitaxial structure 210 is formed in the trench 204 and continually extends upwards to form a pentagon-like shape.

Figure 3:
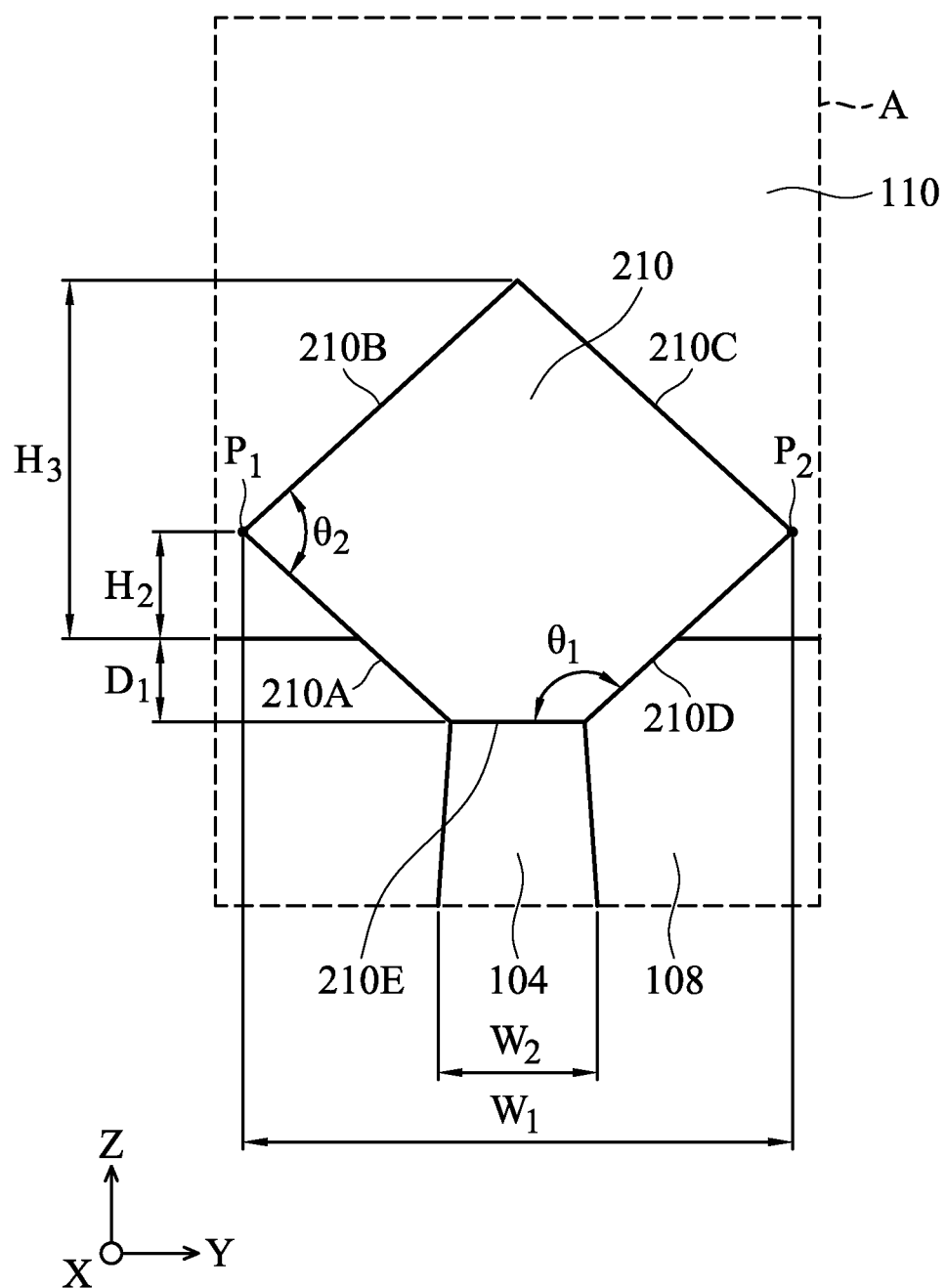
FIG. 3 is an enlarged representation of region A of FIG. 2F, in accordance with some embodiments of the disclosure.

FIG. 3 is an enlarged representation of region A of FIG. 2F, in accordance with some embodiments of the disclosure. As shown in FIG. 3, the epitaxial structure 210 has the pentagon-like shape. The epitaxial structure 210 has a first surface 210A, a second surface 210B, a third surface 210C, a fourth surface 210D and a fifth surface 210E. Each of the first surface 210A, a second surface 210B, a third surface 210C, a fourth surface 210D has a (111) crystallographic orientation.

A first intersection $P_1$ between the first surface 210A and the second surface 210B is higher than a top surface of the isolation structure. A second intersection $P_2$ between the third surface 210C and the fourth surface 210D is higher than a top surface of the isolation structure. The first intersection $P_1$ and the second intersection $P_2$ are substantially in the same level. The first intersection $P_1$ extends from the top surface of the isolation structure 108 to a height $H_2$. In some embodiments, the height $H_2$ is in a range about 0.1 nm to about 50 nm. An angle $\theta_1$ between the fifth surface 210E and the first surface 210A is in a range from about 90 degrees to about 175 degrees. An angle $\theta 2$ between the first surface 210A and the second surface 210B is in a range from 10 degrees to about 175 degrees.

As shown in FIG. 3, the epitaxial structure 210 has a height $H_3$ and a width $W_1$. In some embodiments, the height $H_3$ is in a range from about 1 nm to about 100 nm. If the height $H_3$ is too great, the electric resistance becomes lower. If the height $H_3$ is too small, electric resistance becomes higher to impact device speed. In some embodiments, the width $W_1$ is in a range from about 1 nm to about 100 nm. If the width $W_1$ is too great, the epitaxial structure 210 may merge with neighbor one and cause short circuit effect. If the width $W_1$ is too small, a contact window for contacting with the epitaxial structure 210 will become narrow, and therefore the circuit effect may be broken. The fin structure 104 has a width $W_2$. In some embodiments, the width $W_2$ of the fin structure 104 is smaller than width $W_1$ of the epitaxial structure 210.

In addition, a ratio ($H_3/W_1$) of the height $H_3$ of the epitaxial structure 210 to width $W_1$ of the epitaxial structure 210 is in a range from about 1 to about 100. If the ratio is too great, the epi Si height will be short to affect resistance value. If the ratio is too small, the epi Si volume will be smaller to reduce tension of device. Both of all will impact the mobility of device.

The epitaxial structure 210 includes a single-element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP).

The epitaxial structure 210 is formed by an epi process. The epi process may include a selective epitaxial growth (SEG) process, a chemical vapor deposition (CVD) process (e.g., vapor-phase epitaxy (VPE), a low pressure chemical vapor deposition (LPCVD) and/or ultra-high vacuum CVD (UHV-CVD)), molecular beam epitaxy, another applicable epi processes, or combinations thereof. The formation process of the epitaxial structure 210 may use gaseous and/or liquid precursors, which may interact with the composition of the fin structure 104 thereunder.

The epitaxial structure 210 may be doped or undoped in-situ during the epi process. For example, the epitaxially grown SiGe epitaxial structure may be doped with boron; and the epitaxially grown Si epitaxial structure may be doped with carbon to form a Si:C epitaxial structure, phosphorous to form a Si:P epitaxial structure, or both carbon and phosphorous to form a SiCP epitaxial structure. The doping may be achieved by an ion implantation process, plasma immersion ion implantation (PIII) process, gas and/or solid source diffusion process, another suitable process or combinations thereof. The epitaxial structure 210 may further be exposed to annealing processes, such as a rapid thermal annealing process. The annealing process is used to activate the dopants. The annealing process includes rapid thermal annealing (RTA) and/or laser annealing process.

If the epitaxial structure 210 is not doped in-situ, a second implantation process (i.e., a junction implant process) is performed to dope the epitaxial structure 210.

The fin structure 104 includes a channel region (not shown) surrounded or wrapped by the gate electrode 110. The lattice constants of the epitaxial structure 210 are different from the substrate 102, in that the channel regions are strained or stressed to enable carrier mobility of the FinFET device structure and enhance the FinFET device structure performance.

Afterwards, The FinFET device structure may continue to undergo other processes to form other structures or devices. In some embodiments, metallization includes vertical interconnects, such as conventional vias or contacts, and horizontal interconnects, such as metal lines. The various interconnection features may implement various conductive materials including copper, tungsten, and/or silicide.

The performance of the FinFET device structure is relative to the volume of the epitaxial structure 210. If the volume of the epitaxial structure 210 is too small, the operation speed of the FinFET device structure is too small to meet the requirement.

As mentioned above, if the fin sidewall spacers 105 are remaining on the isolation structure 108, the growth volume of the epitaxial structure is limited by the fin sidewall spacers 105. In order to obtain a large volume of the epitaxial structure, the fin sidewall spacers 105 are completely removed. In addition, a portion of the isolation structure 108 is removed to enlarge the width of the trench 204. It should be noted that the trench 204 is designed to have a depth $D_1$ and angle $\theta_1$, and therefore the epitaxial structure 210 has more space to grow or be extended.

It should be noted that the volume and the height $H_1$ of the epitaxial structure 210 are controlled by adjusting the depth $D_1$ and angle $\theta_1$ of the trench 204. Once the volume and the heights $H_1$ of the epitaxial structure 210 are controlled well, the performance of the FinFET device structure is further improved. More specifically, the operation speed of the FinFET device structure is further increased. In addition, the resistance of the gate electrode 110 may be reduced.

Embodiments for forming fin field effect transistor (FinFET) device structure are provided. The FinFET device structure includes an isolation structure formed on a substrate, and a fin structure extending above the substrate. A trench is formed by recessing a portion of the fin structure and a portion of the isolation structure. An epitaxial structure is formed on the fin structure and in the trench. The epitaxial structure is adjacent to the gate stack structure. The volume and the height of the epitaxial structure are controlled by adjusting a depth and an angle of a trench. Once the volume of the epitaxial structure is efficiently controlled, the performance of the FinFET device structure is further improved. More specifically, the operation speed of the FinFET device structure is further increased.

In some embodiments, a fin field effect transistor (FinFET) device structure is provided. The FinFET structure includes a substrate and an isolation structure formed on the substrate. The FinFET structure also includes a fin structure extending above the substrate, and the fin structure is embedded in the isolation structure. The FinFET structure further includes an epitaxial structure formed on the fin structure, the epitaxial structure has a pentagon-like shape, and the interface between the epitaxial structure and the fin structure is lower than the top surface of the isolation structure.

In some embodiments, a fin field effect transistor (FinFET) device structure is provided. The FinFET structure includes a substrate and an isolation structure formed on the substrate. The FinFET structure also includes a fin structure extending above the substrate, and the fin structure protrudes from the isolation structure. The FinFET structure further includes an epitaxial structure formed on the fin structure, the epitaxial structure comprises a bottom surface and a first surface adjoined to the bottom surface, and an angle between the bottom surface and the first surface is in a range from about 90 degrees to about 175 degrees.

In some embodiments, a method for forming a fin field effect transistor (FinFET) device structure is provided. The method includes providing a substrate and forming an isolation structure on the substrate. The method also includes forming a fin structure above the substrate, and the fin structure is embedded in the isolation structure. The method further includes forming fin sidewall spacers on a top surface and sidewalls the fin structure and removing the fin sidewall spacers to expose the fin structure. The method includes recessing a portion of the fin structure and a portion of the isolation structure to form a trench in the isolation structure. The method further includes epitaxially growing an epitaxial structure from the trench, the epitaxial structure is formed over the fin structure, and an interface between the epitaxial structure and the fin structure is lower than a top surface of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
  a fin structure embedded in an isolation structure, wherein a top surface of the fin structure intersects a top surface of the isolation structure at an angle of greater than 90° and less than about 175°, wherein the angle is measured from a portion of the fin structure that is embedded in the isolation structure to a sidewall of the isolation structure; and
  an epitaxial structure formed on a surface of the fin structure, wherein a cross section of the epitaxial structure has a pentagon-like shape, and wherein an interface between the epitaxial structure and a first portion of the fin structure is lower than a top surface of the isolation structure.

2. The semiconductor device of claim 1, wherein the epitaxial structure extends above the isolation structure between about 1 nm and about 100 nm.

3. The semiconductor device of claim 2, wherein the epitaxial structure has a width of between about 1 nm and about 100 nm.

4. The semiconductor device of claim 1, wherein a ratio of a height of the epitaxial structure and a width of the epitaxial structure is between about 1 and about 100.

5. The semiconductor device of claim 1, wherein the epitaxial structure extends into the isolation structure a distance of between about 0.1 nm and about 50 nm.

6. The semiconductor device of claim 1, wherein the epitaxial structure comprises multiple surfaces with a (111) crystallographic orientation.

7. A semiconductor device comprising:
a semiconductor fin over a substrate, the semiconductor fin having a top surface recessed from an isolation structure, wherein a top surface of the semiconductor fin intersects a top surface of the isolation structure at an angle of greater than 90° and less than about 175°, wherein the angle is measured from a portion of the semiconductor fin that is embedded in the isolation structure to a portion of the isolation structure that is on a sidewall of the isolation structure; and
a source/drain region located over and in physical contact with the top surface.

8. The semiconductor device of claim 7, wherein the source/drain region has multiple sides which intersect at a first point, the first point being located above a top surface of the isolation structure a distance between about 0.1 nm and about 50 nm.

9. The semiconductor device of claim 7, wherein the source/drain region extends away from the isolation structure a distance of between about 1 nm and about 100 nm.

10. The semiconductor device of claim 7, wherein the source/drain region has a width of between about 1 nm and about 100 nm.

11. The semiconductor device of claim 7, wherein the top surface of the semiconductor fin is recessed a depth of between about 0.1 nm and about 50 nm.

12. The semiconductor device of claim 7, wherein the source/drain region has a pentagon-like shape.

13. The semiconductor device of claim 7, wherein the source/drain region comprises multiple surfaces with a (111) crystallographic orientation.

14. The semiconductor device of claim 7, wherein the source/drain region is in physical contact with the isolation structure.

15. A semiconductor device comprising:
an isolation region located over a substrate; and
an epitaxial source/drain region extending into the isolation region to make contact with a semiconductor fin, wherein a top surface of the semiconductor fin intersects a top surface of the isolation region at an angle of greater than 90° and less than about 175°, wherein the angle is measured from a portion of the semiconductor fin that is embedded in the isolation region to a sidewall of the isolation region.

16. The semiconductor device of claim 15, wherein the epitaxial source/drain region extends out of the isolation region a first distance of between about 1 nm and about 100 nm.

17. The semiconductor device of claim 15, wherein the epitaxial source/drain region has a width outside of the isolation region of between about 1 nm and about 100 nm.

18. The semiconductor device of claim 15, wherein the epitaxial source/drain region has multiple sides which intersect at a first point, the first point being located above a top surface of the isolation region a distance between about 0.1 nm and about 50 nm.

19. The semiconductor device of claim 15, wherein the epitaxial source/drain region has a pentagon-like shape.

20. The semiconductor device of claim 15, wherein the epitaxial source/drain region extends into the isolation region to a depth of between about 0.1 nm and about 50 nm.

* * * * *